United States Patent [19]
Manjkow et al.

[11] Patent Number: 6,098,304
[45] Date of Patent: *Aug. 8, 2000

[54] APPARATUS FOR REDUCING DELAMINATION WITHIN A POLYCIDE STRUCTURE

[75] Inventors: Joseph Manjkow, Daly City; Jeffrey M. Fregger, San Jose, both of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/686,190

[22] Filed: Jul. 26, 1996

[51] Int. Cl.[7] .................................................... F26B 21/06
[52] U.S. Cl. .................................... 34/79; 34/202; 34/218
[58] Field of Search ............................. 34/79, 201, 202, 34/218; 438/584, 680, 683, 684, 706, 913, 906; 118/728; 414/277

[56] References Cited

U.S. PATENT DOCUMENTS

| | | |
|---|---|---|
| 5,083,381 | 1/1992 | Aigo ........................................ 34/58 X |
| 5,130,266 | 7/1992 | Huang et al. ............................... 437/44 |
| 5,147,820 | 9/1992 | Chittipeddi et al. ...................... 437/193 |
| 5,238,499 | 8/1993 | Van Der Ven et al. .................. 118/724 |
| 5,303,482 | 4/1994 | Yamashita et al. .................... 34/218 X |
| 5,363,867 | 11/1994 | Kawano et al. ........................ 134/95.2 |
| 5,411,358 | 5/1995 | Garric et al. ............................. 414/277 |
| 5,422,311 | 6/1995 | Woo ......................................... 437/193 |
| 5,553,394 | 9/1996 | Cosley ........................................ 34/218 |
| 5,578,532 | 11/1996 | Van Der Ven et al. ................. 438/584 |

*Primary Examiner*—Stephen Gravini
*Attorney, Agent, or Firm*—Sawyer Law Group LLP

[57] ABSTRACT

A method and apparatus is disclosed for reducing delamination within a polycide structure. The apparatus is a purge box added to a vapor etcher structure that surrounds a cassette of silicon wafers both before and after the vapor etch process. The box contains a continuous flow of nitrogen. A cassette of wafers is placed into the box which is designed to allow removal of an individual wafer for vapor etching and return of the wafer after etching and prior to a subsequent deposition step. The purge box includes a manifold for directing the flow of nitrogen into the box so that all wafers are constantly bathed in the nitrogen flow. The cassette of wafers remains in the purge box until transport to the next manufacturing step.

9 Claims, 4 Drawing Sheets

APPARATUS FOR REDUCING DELAMINATION WITHIN A POLYCIDE STRUCTURE

BACKGROUND OF THE INVENTION

1. Field of the Invention

The invention relates generally to a method and apparatus for reducing delamination within a polycide structure. In particular, the invention relates to a method and apparatus for reducing separation at the interface between tungsten silicide and the doped polysilicon layers of a polycide. In the method of the invention a silicon wafer containing a doped polysilicon layer that has been deglazed and vapor etched in HF is returned to a cassette that is surrounded by an apparatus containing a continuous flow of nitrogen. The etched wafer remains in the nitrogen flow of the apparatus until the next processing step. Separation, presumably the result of surface oxidation on the polysilicon layer, appears to be reduced by the present invention.

2. Brief Description of the Prior Art

In the production of integrated circuits, it is common to form refractory metal polycides from refractory metal suicides and polysilicon, where the metal silicide has been formed by reaction of a refractory metal compound and silane. Titanium, tantalum, tungsten, molybdenum and cobalt, are some of the metals that may be used to form the polycide. The polycide layers are relatively high conductors used in complementary-metal-oxide-semiconductor (CMOS) devices. After a lithographic patterning step, polycides are used in materials for gate and interconnect formation.

Polycides are typically produced from tungsten or titanium silicide and doped polysilicon. A deglazed and vapor HF etched layer of doped polysilicon is deposited with metal silicide and then annealed at high temperatures to form the polycide.

An inspection of the wafer after annealing may reveal separation at the interface between the metal silicide and polysilicon. This "lifting" or "delamination" phenomenon has been observed by others (see Woo et. al., U.S. Pat. No. 5,422,311; Chittipeddi et. al., U.S. Pat. No. 5,147,820; and Huang et. al., U.S. Pat. No. 5,130,266). The portions of the wafer exhibiting separation cannot be processed any further, resulting in low product yields for the particular manufacturing process.

Solutions to the problem vary. Woo et. al. show a method for manufacturing a reduced resistivity conductor where tungsten silicide is deposited on a polysilicon film (etched to approximately 400 Å). The metal silicide and polysilicon are then annealed to form a polycide. In addition to the polycide, a silicon layer forms at the interface between the polysilicon and silicide. As the silicon forms, adhesion between the two layers is increased preventing the lifting phenomenon.

Chittipeddi et. al., show a method for making a polycide by varying the conditions for the doped polysilicon depositions and decreasing the dopant concentration creating layers within the polysilicon. When the metal silicide layer is deposited onto the polysilicon, improved uniformity and planarity is obtained due to stress accommodations provided by the underlying layering. Chittipeddi et al. note that interfacial properties of the polysilicon were improved using this method.

Huang et. al., describe a method for making a lightly doped drain MOSFET device which overcomes the "peeling problem" of metal polycide layers on a polycide gate. Huang et. al. delete several steps of the normal manufacturing process, namely, thermal oxidation after polycide etching, densification after deposition of the silicon dioxide layer for spacer preparation, and silicon oxide capping of the refractory metal silicide layer after spacer formation. The modified process provides a non-peeling polycide gate.

Although these solutions have provided some relief from delamination, the solutions are specific to each individual process. Each instance of delamination must be addressed by tailoring the solution to the specific process. The present invention provides a general solution which may be used in numerous processes where polycides are formed.

SUMMARY OF THE INVENTION

It is therefore an object of the present invention to provide a method and apparatus for eliminating the occurrence of lifting of a metal silicide layer from a layer of polysilicon.

It is another object of the present invention to provide a method and apparatus for significantly reducing the occurrence of lifting of a tungsten silicide layer from a layer of doped polysilicon.

It is a further object of the present invention to provide a method and apparatus for reducing delamination within a polycide, namely, between the metal silicide and doped polysilicon.

It is yet another object of the present invention to provide a method and apparatus for reducing metal silicide lifting where a polycide is formed by depositing a layer of doped polysilicon and a layer of tungsten silicide where both layers are then annealed at high temperatures.

Briefly, the preferred embodiment of the present invention is a method including a purge box mounted to a vapor etcher which allows for a cassette of wafers to be placed inside the box. Each wafer is individually processed in the vapor etcher and returned to the box which contains a continuous flow of inert gas. The purge box includes a manifold for directing a flow of inert gas into the box so that the surfaces of the wafers are constantly bathed in the inert gas flow. The wafers remain in the purge box until the cassette is removed from the box for the next processing step.

DETAILED DESCRIPTION OF THE PREFERRED EMBODIMENT

As described above, this invention provides a method and apparatus for reducing the occurrence of lifting of a metal silicide layer deposited on a doped polysilicon. In the preferred embodiment, a polycide, formed from tungsten silicide and doped polysilicon, illustrates the invention. A doped polysilicon film is deposited on a silicon wafer and then deglazed followed by vapor etching with HF. Tungsten silicide is then deposited on the wafer and annealed at a temperature of about 610° C. Separation at the interface between the metal silicide and polysilicon does not become apparent until the high temperature annealing step.

Native oxides form quickly on the surface of a freshly etched polysilicon layer and may interfere with adhesion between the polysilicon and a subsequently deposited metal silicide layer. This results in lifting of the metal silicide layer. By bathing the wafers in inert gas immediately after removal from the vapor HF etch process, contact with oxygen is minimized which reduces the formation of native oxides. Thus, the invention provides a purge box continuously flushed with an inert gas, preferably nitrogen. Wafers are individually processed and returned to the purge box until all wafers have been processed and the wafers are ready for transfer to the next processing step.

Figure 1:
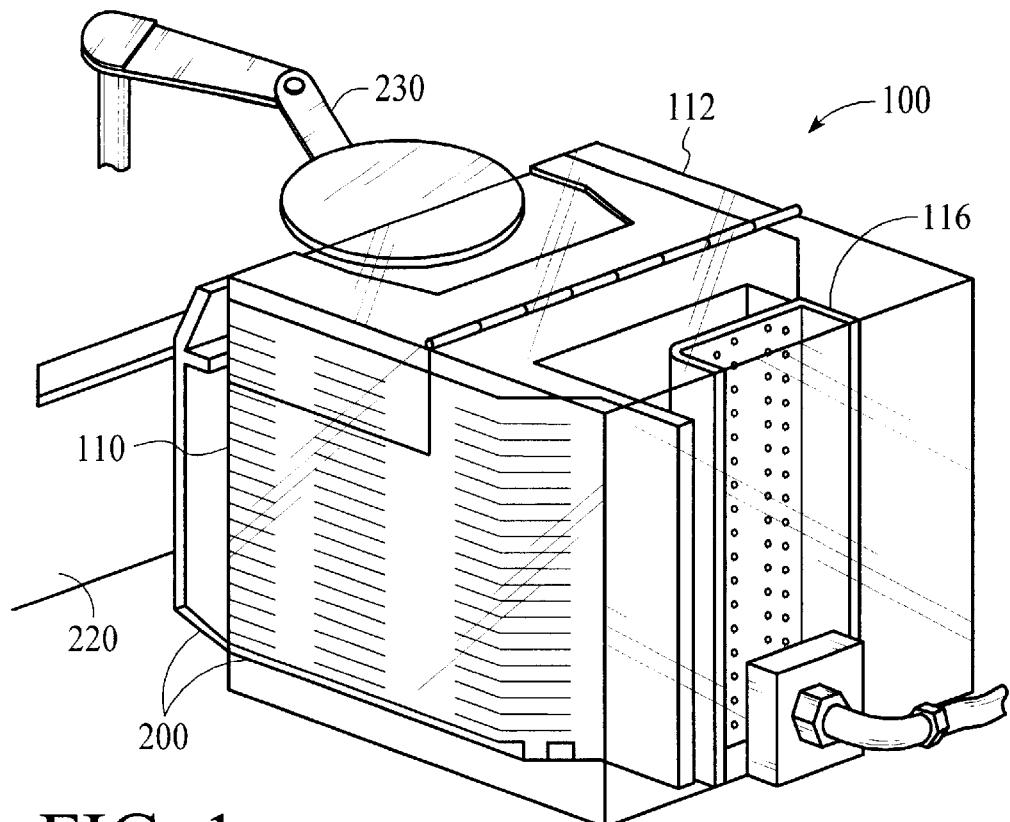

Referring to FIG. 1, purge box 100 encloses a wafer cassette 200. The cassette is a transport mechanism for the wafers between processing steps and a storage mechanism for the wafers during processing. In the preferred embodiment, an Excalibur in situ rinse vapor HF etcher 220 (manufactured by FSI International) etches the wafers prior to tungsten silicide deposition. The purge box is positioned on the etcher such that load arm 230 has access to the purge box. The cassette of wafers is placed into the purge box. The load arm retrieves a wafer from the cassette for etching and then returns the wafer to the cassette for transport to the next processing step. The purge box may be designed to provide an opening 110 and lid 112 to allow for ease of cassette loading by an operator. Because vapor etchers differ in load arm configuration and cassette structure, the purge box design is dependent on the specific vapor etcher used.

Figure 2:
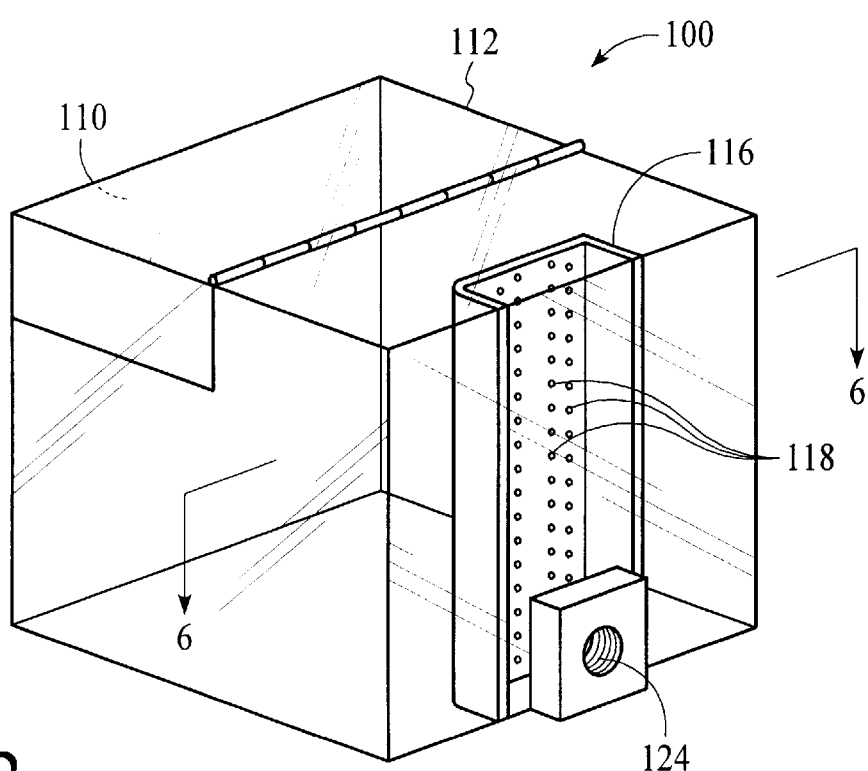

Referring to FIG. 2, the purge box is constructed from a nonreactive material that preferably does not out-gas oxygen. In the preferred embodiment, clear polycarbonate is used, and more preferably 3/16 inch clear polycarbonate. A manifold 116 directs a flow of nitrogen into the purge box. Individual holes 118 are spaced apart and drilled at angles to provide a nitrogen flow that fully bathes each wafer in nitrogen during the time the wafer remains in the purge box. We will refer to this time period as the queue time. Once a wafer has been etched, it is returned to the cassette inside the nitrogen purge box where it remains until all remaining wafers are etched.

In the preferred embodiment, the cassette holds 25 wafers for etching. Loading, unloading, and processing a single wafer lasts approximately 2 minutes, therefore, a first wafer returned to the cassette after etching has a queue time of approximately 1 hour while the remaining 24 wafers are processed. In the absence of nitrogen, an oxide layer of about 50 Å to 100 Å may form during this one hour queue time. A 50 Å oxide layer can reduce adhesion of a subsequently deposited metal silicide layer.

Figure 3:
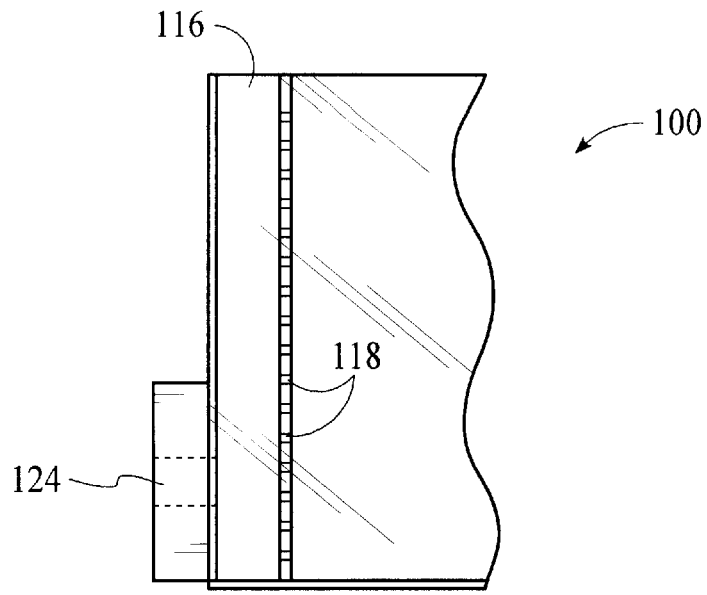
Figure 4:
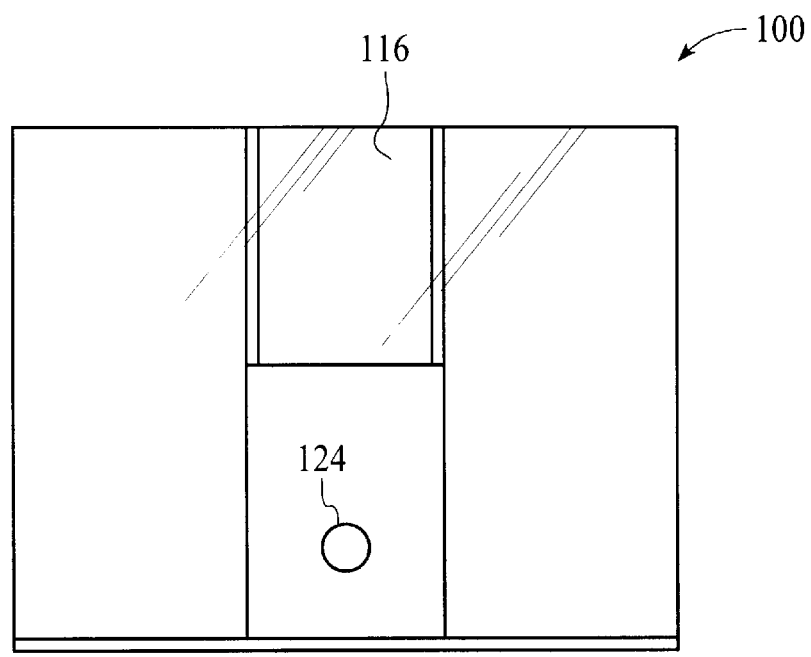
Figure 5:
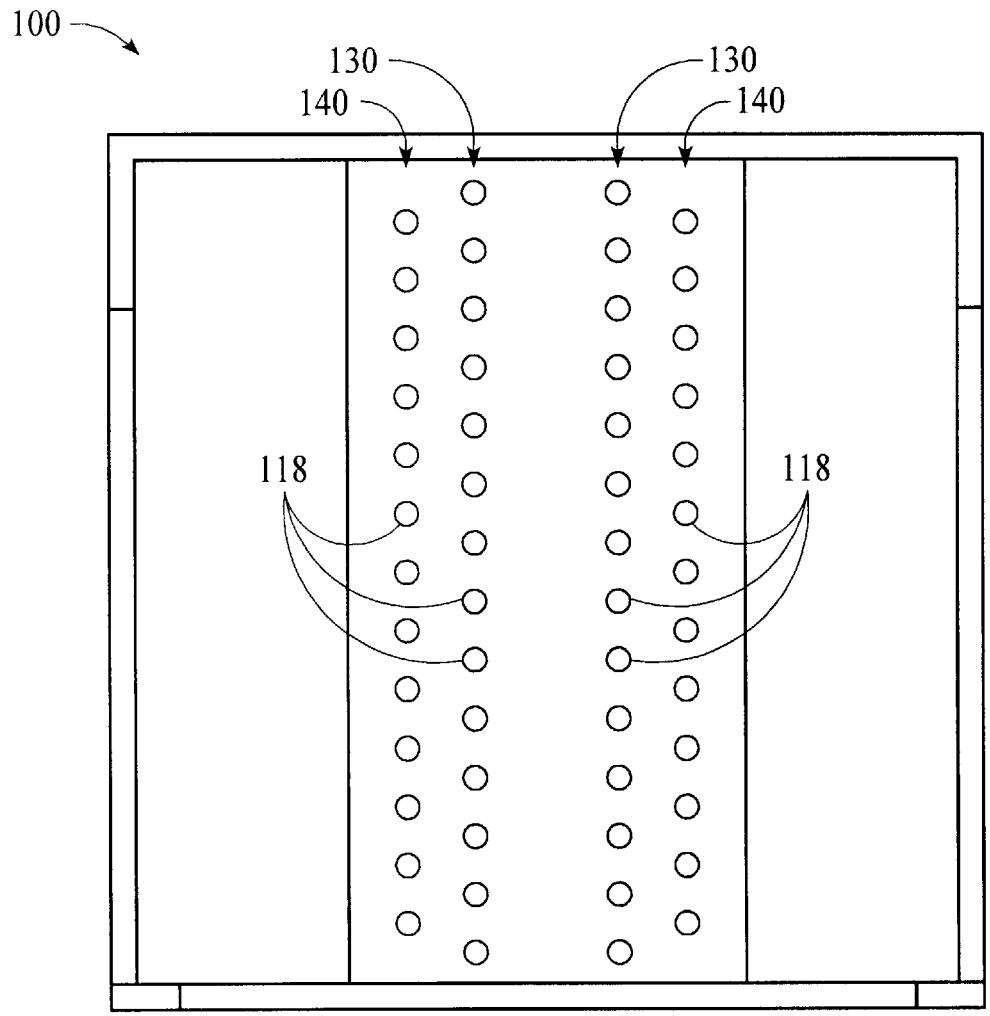
Figure 6:
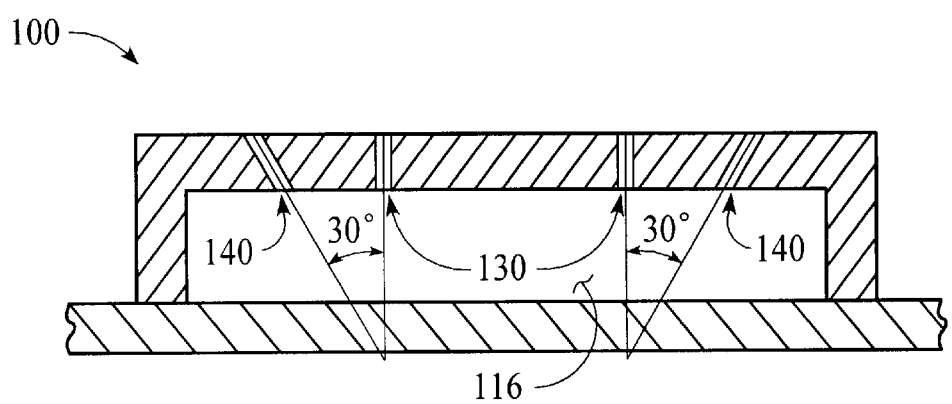

Referring to FIG. 2, manifold 116 provides a means to introduce and direct the flow of nitrogen into the purge box. Manifold 116 is shown as attached to the inside of the purge box. Inlet 124 provides for attachment of an externally controlled nitrogen supply to the manifold 116. In the preferred embodiment shown in FIGS. 3 and 4, the inlet is a ½ inch thick block of polycarbonate which has been cemented, drilled (through inlet 124 and purge box 100), and tapped. As shown in FIG. 5, a plurality of holes 118 are drilled through the manifold into the purge box allowing nitrogen to access the wafers. In the preferred embodiment (FIG. 5), the holes are spaced at specific intervals and drilled into the box at angles designed to direct the nitrogen flow to all wafers in the purge box. FIG. 6 shows the angle of the holes through the polycarbonate. Angled holes 140 allow the nitrogen to flow smoothly in conjunction with the angles created by the cassette structure, thus promoting an even nitrogen flow across the surfaces of the wafers. The number, spacing, and angle of the holes are dependent on the purge box and cassette design. In the preferred embodiment, there are 114 holes divided into four rows, 130 and 140. As shown in FIGS. 5 and 6, the two inner rows 130 are drilled straight into the box while the two outer rows 140 are drilled at 30 degree angles into the box.

FIGS. 3 through 6, show the exact dimensions of the purge box of the preferred embodiment. Other box designs and sizes for particular cassette types or tool and load arm configurations are contemplated by the present invention. As shown in FIG. 1, the front of the box is continually open, to allow for the loading and unloading of a cassette.

Figure 7:
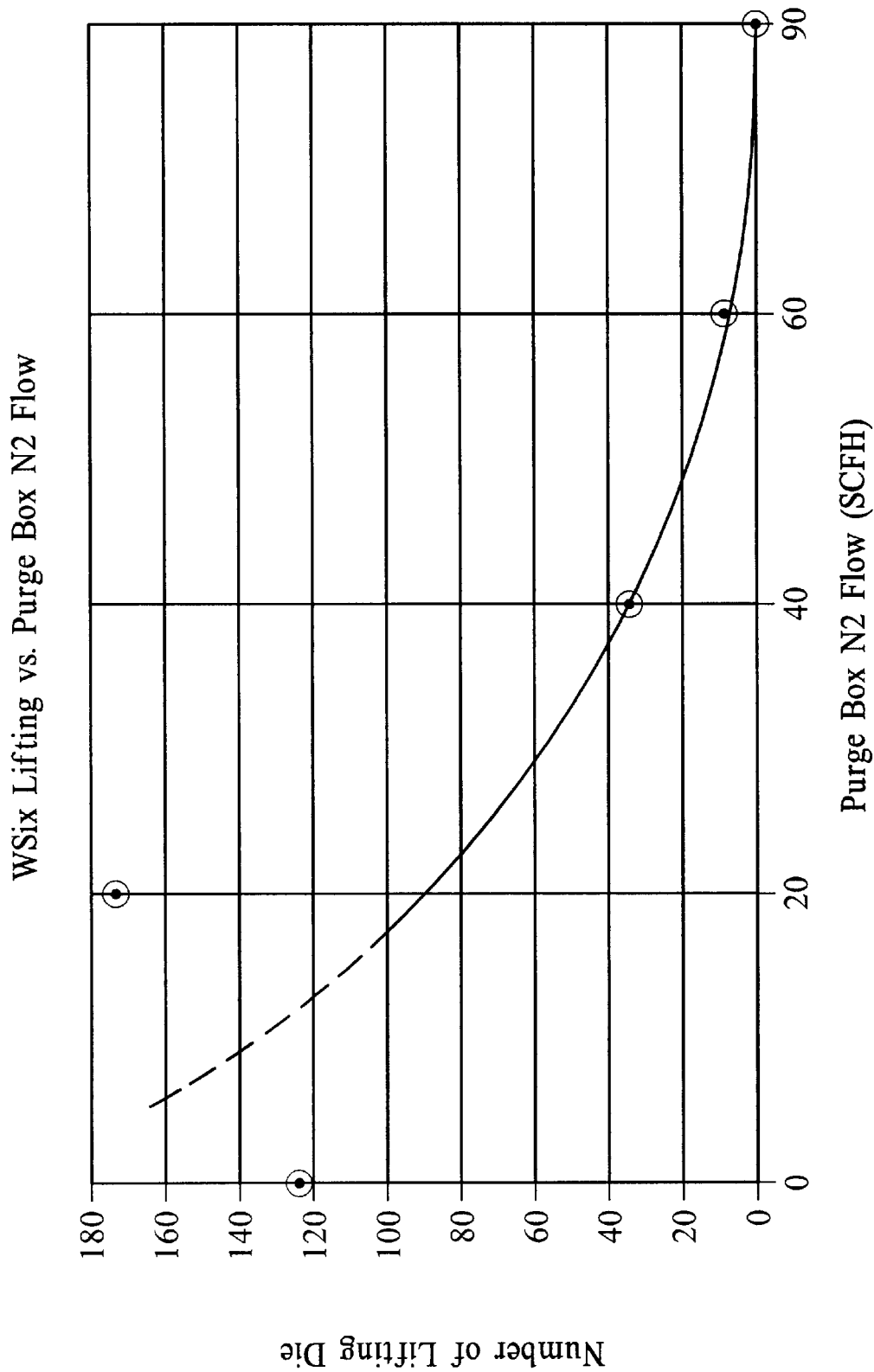

In the preferred embodiment, the nitrogen flow to the manifold is optimized at between about 90 SCFH and 100 SCFH. As shown in FIG. 7, the flow of nitrogen exhibits an asymptotically decreasing relationship with the number of die that show delamination after annealing.

After etching, the wafers of the preferred embodiment are deposited with tungsten silicide and annealed at high temperatures (in a poly cap deposition step). The poly cap step lasts for about 2 hours at a temperature of about 610° C. Delamination of the wafers is observed after this deposition step. Up to 100% of the wafer die may show delamination following the poly cap step.

The preferred embodiment of the present invention allows for queue times of at least two hours and up to 18 hours. Purge box queue times are dependent on the size and configuration of the box and the nitrogen flow rate. Increased queue time allows for flexibility in personnel and process scheduling.

The following examples illustrate the results obtained using the method of the present invention.

EXAMPLE 1

In this example, 12 test wafers were etched and then split into three identical test groups. For each test group, four test wafers were placed into a 25 slot cassette at positions 1, 2, 15, and 25. Blank wafers were placed in the remaining slots. The three cassettes were separately placed into the purge box and processed under varying conditions. For test groups 1 and 2, the nitrogen flow was off with the purge box lid open. Test group 3 was processed with the nitrogen flow on at 90 SCFH and the purge box lid closed. All test groups were allowed a 1 hour queue time. The 12 test wafers were then deposited with tungsten silicide and annealed at 610° C. in a poly cap deposition step. After the deposition step, the wafers were visually analyzed to determine the number of die showing lifting on the wafers. The numbers were then averaged for each test group. The results are shown in Table 1.

TABLE 1

| Test Group | $N_2$ Flow | Lid | Lifting Die (Out of 460) |
| --- | --- | --- | --- |
| 1 | 0 | open | 34% |
| 2 | 0 | open | 37% |
| 3 | 90 | closed | 0% |

Test groups 1 and 2 exhibit significant lifting while test group 3 shows no lifting. These results demonstrate that the method and apparatus of the present invention significantly reduces and even eliminates lifting at the polysilicon/metal silicide interface.

EXAMPLE 2

The flow rate of nitrogen into the manifold should be high enough to reduce oxidation of the doped polysilicon surface. In this example, 12 test wafers were prepared as in example 1, however, the nitrogen flow was varied for each test group while the purge box lid remained closed. The results are shown in Table 2.

TABLE 2

| Test Group | N$_2$ Flow | Lid | Lifting Die (Out of 460) |
| --- | --- | --- | --- |
| 1 | 20 | closed | 38% |
| 2 | 40 | closed | 7% |
| 3 | 60 | closed | 3% |

These results show that the flow rate of nitrogen must be between 20 and 40 SCFH to reduce the occurrence of lifting and must be greater than 60 SCFH to eliminate lifting.

EXAMPLE 3

In the next example, 6 test wafers were separated into three test groups with the nitrogen flow either off, or on at 90 SCFH and the purge box lid either open or closed. The number of lifting die on each wafer were then counted and averaged for each test group. The results are shown in Table 3.

TABLE 3

| Test Group | N$_2$ Flow | Lid | Lifting Die (Out of 460) |
| --- | --- | --- | --- |
| 1 | 0 | open | 26% |
| 2 | 0 | closed | 62% |
| 3 | 90 | closed | 0% |

The results show that a nitrogen flow of 90 SCFH appears to eliminate die lifting. The results also show that the purge box lid position has an effect on lifting.

EXAMPLE 4

The queue times for examples 1 through 3 were one hour, however, queue times greater than one hour may be desirable to facilitate personnel and machine scheduling. In this example, 4 test wafers were etched and separated into two test groups. In test group 1, the nitrogen flow was off and the queue time was two hours. In test group 2, the nitrogen flow was on at 100 SCFH with a two hour queue time. The results are shown in Table 4.

TABLE 4

| Test Group | N$_2$ Flow | Lid | Lifting Die (Out of 460) |
| --- | --- | --- | --- |
| 1 | 0 | closed | 55% |
| 2 | 100 | closed | 0% |

These results show that two hour queue times can be achieved with a nitrogen flow of 100 SCFH.

EXAMPLE 5

In example 5, 23 test wafers were etched and separated into two different groups. In test group 1, the nitrogen flow was off, the lid was closed, and the queue time was one hour. Test group 2 had a 100 SCFH nitrogen flow and a closed lid, however, the queue time was increased to 18 hours. The wafers were analyzed for the number of die lifting and averaged for each wafer.

TABLE 5

| Test Group | Wafer Number | N$_2$ Flow | Lid | Lifting Die (Out of 460) |
| --- | --- | --- | --- | --- |
| 1 | 01 | 0 | closed | 10% |
| 1 | 02 | 0 | closed | 35% |
| 1 | 03 | 0 | closed | 25% |
| 1 | 04 | 0 | closed | 45% |
| 1 | 05 | 0 | closed | 30% |
| 1 | 06 | 0 | closed | 40% |
| 1 | 07 | 0 | closed | 35% |
| 1 | 08 | 0 | closed | 30% |
| 1 | 09 | 0 | closed | 35% |
| 1 | 10 | 0 | closed | 30% |
| 1 | 11 | 0 | closed | 45% |
| 2 | 13 | 100 | closed | 60% |
| 2 | 14 | 100 | closed | 75% |
| 2 | 15 | 100 | closed | 65% |
| 2 | 16 | 100 | closed | 40% |
| 2 | 17 | 100 | closed | 35% |
| 2 | 18 | 100 | closed | 30% |
| 2 | 19 | 100 | closed | 5% |
| 2 | 20 | 100 | closed | <5% |
| 2 | 21 | 100 | closed | 0% |
| 2 | 22 | 100 | closed | 0% |
| 2 | 23 | 100 | closed | 0% |
| 2 | 24 | 100 | closed | 0% |

The results show that about half of the wafers from test group 2 lift, while half do not lift. This indicates that 18 hour queue times can be achieved with no lifting, however, further modifications to the method and apparatus are necessary to minimize lifting subsequent to an 18 hour queue time.

Although the present invention has been described above in terms of specific embodiments, it is anticipated that alterations and modifications will become apparent to those skilled in the art. It is therefore intended that the following claims be interpreted as covering all alterations and modifications that fall within the true spirit and scope of the invention.

What is claimed is:

1. An apparatus for reducing delamination of a polycide structure on a silicon wafer comprising:
    (a) enclosure means having an interior for storing at least one wafer that has been deposited with polysilicon and etched; and
    (b) gas supply means for injecting a continuous flow of inert gas into the interior, the gas supply means including gas directing means so as to bathe all surfaces of the wafer in the gas;
    wherein a queue time of at least approximately one hour may be established in the enclosure means while reducing delamination of the polycide structure.

2. The apparatus of claim 1 where the wafer is contained in a wafer cassette which is positioned inside the enclosure means.

3. The apparatus of claim 2 where the enclosure means is open to allow the cassette to be positioned inside the enclosure means.

4. The apparatus of claim 3 where the enclosure means is shaped to optimize the flow of gas to a top and bottom surface of the wafer such that the occurrence of delamination is reduced.

5. The apparatus claim 4 where the enclosure means is rectangular in shape.

6. The apparatus of claim 5 where the enclosure means has a lid.

7. The apparatus recited in claim 1 wherein the gas supply means includes:

(a) a manifold attached to the enclosure means;
(b) an inlet to the manifold for receiving a flow of gas; and
(c) wherein the directing means includes a plurality of holes in the manifold, the holes configured to direct the gas so as to bathe all surfaces of the at least one wafer in the gas.

8. The apparatus recited in claim 1 wherein the enclosure means does not out-gas oxygen.

9. The apparatus recited in claim 1 wherein the enclosure means and the manifold are constructed from polycarbonate.

* * * * *